(12) United States Patent
Yang et al.

(10) Patent No.: US 10,261,419 B2
(45) Date of Patent: Apr. 16, 2019

(54) MAGNET ARRAY FOR MOVING MAGNET PLANAR MOTOR

(71) Applicant: NIKON CORPORATION, Tokyo (JP)

(72) Inventors: Pai-Hsueh Yang, Palo Alto, CA (US);
Takakuni Goto, Kumagaya (JP);
Kazuhiro Hirano, Ageo (JP)

(73) Assignee: NIKON CORPORATION (JP)

( * ) Notice: Subject to any disclaimer, the term of this patent is extended or adjusted under 35 U.S.C. 154(b) by 0 days.

(21) Appl. No.: 14/719,821

(22) Filed: May 22, 2015

(65) Prior Publication Data

US 2015/0338750 A1    Nov. 26, 2015

Related U.S. Application Data

(60) Provisional application No. 62/001,957, filed on May 22, 2014.

(51) Int. Cl.
| | |
|---|---|
| *G03B 27/58* | (2006.01) |
| *G03F 7/20* | (2006.01) |
| *H02K 41/02* | (2006.01) |
| *H02K 15/00* | (2006.01) |
| *H02K 41/03* | (2006.01) |
| *H02K 1/27* | (2006.01) |

(52) U.S. Cl.
CPC ............ *G03F 7/20* (2013.01); *G03F 7/70758* (2013.01); *H02K 15/00* (2013.01); *H02K 41/02* (2013.01); *H02K 41/031* (2013.01); *H02K 1/27* (2013.01); *H02K 2201/18* (2013.01); *Y10T 29/49011* (2015.01)

(58) Field of Classification Search
CPC ....... G03F 7/20; G03F 7/70758; H02K 15/00; H02K 1/27; H02K 2201/18; H02K 41/02; H02K 41/031
USPC .......................................................... 355/72
See application file for complete search history.

(56) References Cited

U.S. PATENT DOCUMENTS

| | | | |
|---|---|---|---|
| 6,445,093 B1 | 9/2002 | Binnard | |
| 6,452,292 B1 | 9/2002 | Binnard | |
| 6,496,093 B2 | 12/2002 | Compter et al. | |
| 9,030,057 B2 * | 5/2015 | Binnad | ............... G03F 7/70758 310/12.05 |
| 2002/0149270 A1 * | 10/2002 | Hazelton | ............... H02K 41/03 310/12.06 |
| 2014/0204358 A1 | 7/2014 | Yang et al. | |

FOREIGN PATENT DOCUMENTS

| | | |
|---|---|---|
| WO | WO2013112759 A1 | 8/2013 |
| WO | WO2013112761 A2 | 8/2013 |

\* cited by examiner

*Primary Examiner* — Peter B Kim
(74) *Attorney, Agent, or Firm* — Roeder & Broder LLP; Steven G. Roeder

(57) ABSTRACT

A stage mover for moving a stage relative to a stage base includes a conductor assembly and a magnet assembly. The conductor assembly is coupled to the stage base and a plurality of coil units with each coil unit having one or more coils. Each of the coils has a coil width. The magnet assembly interacts with the conductor assembly and includes a plurality of spaced apart magnet arrays. Each of the magnet arrays is spaced apart from each adjacent magnet array by an array gap that is at least equal to the coil width so that independent and symmetric magnetic flux distribution can be achieved for each of the magnet arrays.

16 Claims, 8 Drawing Sheets though most of the embodiments herein focus on the present invention being used as a wafer stage, it is understood that the present invention can also be used as a reticle stage or any similar stage that requires precise positioning.

MAGNET ARRAY FOR MOVING MAGNET PLANAR MOTOR

RELATED APPLICATION

This application claims priority on U.S. Provisional Application Ser. No. 62/001,957 filed on May 22, 2014, and entitled "MAGNET ARRAY LAYOUT FOR MOVING-MAGNET PLANAR MOTOR". As far as permitted, the contents of U.S. Provisional Application Ser. No. 62/001,957 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer.

Typically, the wafer stage assembly includes a wafer stage base, a wafer stage that retains the wafer, and a wafer stage mover that precisely positions the wafer stage and the wafer. Somewhat similarly, the reticle stage assembly includes a reticle stage base, a reticle stage that retains the reticle, and a reticle stage mover that precisely positions the reticle stage and the reticle. The size of the images and the features within the images transferred onto the wafer from the reticle are extremely small. Accordingly, the precise relative positioning of the wafer and the reticle is critical to the manufacturing of high density, semiconductor wafers.

Recently, planar motors have been used as the wafer stage mover and/or the reticle stage mover. In many applications, it is desired to increase motor force capability and efficiency while limiting the overall footprint of the stage mover, and while also inhibiting motor force ripples and side forces that may otherwise be generated within the stage mover.

SUMMARY

The present invention is directed toward a stage mover for moving a stage relative to a stage base. In certain embodiments, the stage mover comprises a conductor assembly and a magnet assembly. The conductor assembly is coupled to the stage base. Additionally, the conductor assembly includes a plurality of coil units with each coil unit having one or more coils. Each of the coils has a coil width. The magnet assembly interacts with the conductor assembly. The magnet assembly includes a plurality of spaced apart magnet arrays, wherein each of the magnet arrays is spaced apart from each adjacent magnet array by an array gap that is at least equal to the coil width. With this design, independent and symmetric magnetic flux distribution can be achieved for each of the magnet arrays. This reduces motor force ripples and side forces and also makes position measurement easier.

In one embodiment, each of the magnet arrays is spaced apart from each adjacent magnet array by the array gap that is substantially equal to the coil width. Additionally, in one embodiment, each of the coil units includes three coils.

Further, in certain embodiments, the conductor assembly includes a plurality of first axis coil units and a plurality of second axis coil units that are arranged in alternating fashion in a first axis direction and a second axis direction. In one such embodiment, the magnet assembly includes a pair of first axis magnet arrays that interact with one or more of the first axis coil units, and a pair of second axis magnet arrays that interact with one or more of the second axis coil units.

The present invention is further directed toward a stage assembly including a stage base; a stage; and the stage mover as described above that moves the stage relative to the stage base. The stage assembly can further comprise a control system that directs current to one or more of the coil units to create an interaction with one or more of the magnet arrays.

Additionally, the present invention is directed to an exposure apparatus, a device manufactured with the exposure apparatus, and/or a wafer on which an image has been formed by the exposure apparatus. Moreover, the present invention is also directed to a method for moving a device, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
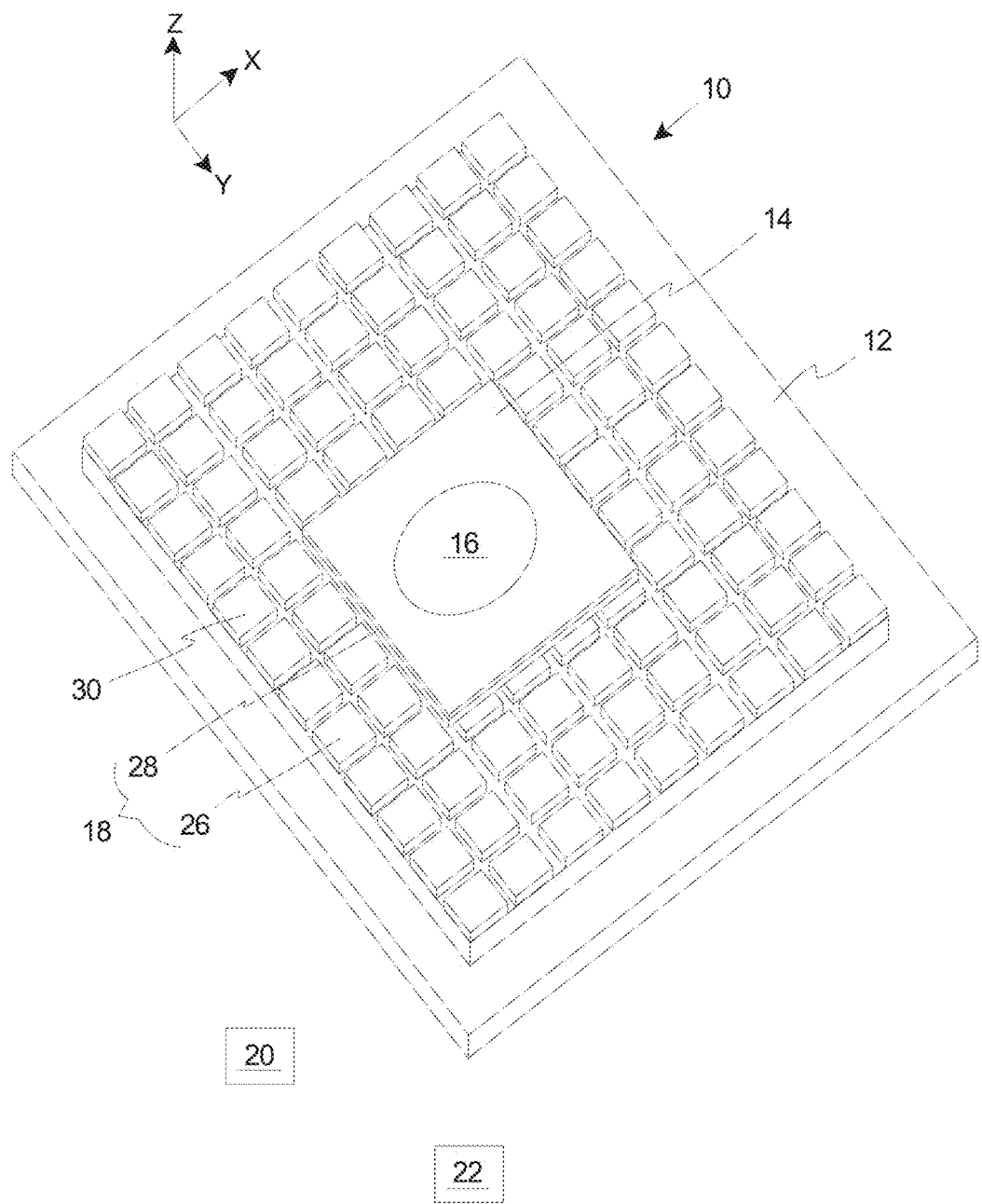
FIG. 1 is a top perspective view of an embodiment of a stage assembly having features of the present invention.

FIG. 1 is a top perspective view of an embodiment of a stage assembly 10 having features of the present invention. As illustrated in this embodiment, the stage assembly 10 includes a stage base 12, a stage 14 that retains a device 16, a stage mover 18, a measurement system 20 (illustrated as a box), and a control system 22 (illustrated as a box). The design of each of these components can be varied to suit the design requirements of the stage assembly 10. In certain applications, the stage assembly 10 can be positioned above a mounting base 524 (illustrated in FIG. 5). The stage mover 18 precisely moves the stage 14 and the device 16 relative to the stage base 12.

Some of the Figures provided herein include an orientation system that designates an X axis, a Y axis that is orthogonal to the X axis, and a Z axis that is orthogonal to the X and Y axes. In these Figures, the Z axis is oriented in the vertical direction. It should be understood that the orientation system is merely for reference and can be varied. For example, the X axis can be switched with the Y axis and/or the stage assembly 10 can be rotated. Moreover, it should be noted that any of these axes can also be referred to as a first, a second, and/or a third axis.

Figure 2:
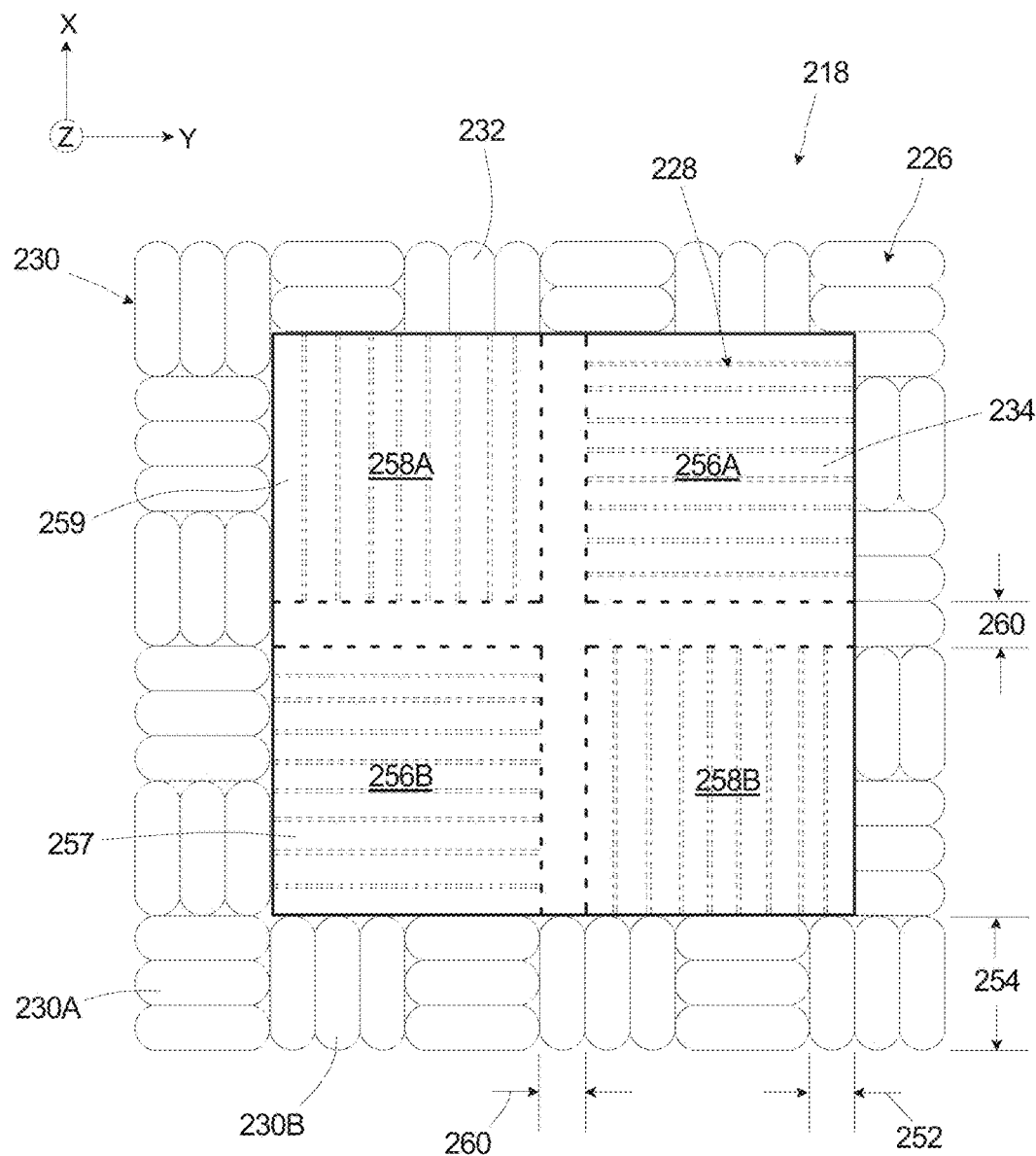
FIG. 2 is a simplified schematic top view illustration of an embodiment of a stage mover having features of the present invention that forms part of the stage assembly illustrated in FIG. 1, the stage mover including a conductor assembly and a magnet assembly.

As an overview, in certain embodiments, the stage mover 18 is uniquely designed to increase motor force capability and efficiency, while limiting the overall footprint of the stage mover 18, and while inhibiting magnetic flux distortion, motor force ripples and side forces that may otherwise be generated within the stage mover 18. For example, in some embodiments, the stage mover 18 includes a conductor assembly 26 and an adjacent magnet assembly 28 that interacts with the conductor assembly 26. In one embodiment, the conductor assembly 26 can include a plurality of coil units 30, and each coil unit 30 can include one or more coils 232 (illustrated in FIG. 2), e.g., three coils 232, that are oriented to provide movement along the X-axis or along the Y-axis. Additionally, the magnet assembly 28 can include a plurality of magnet arrays 234 (illustrated in FIG. 2) that are all spaced apart from one another. More particularly, as illustrated in FIG. 2, for example, each of the magnet arrays 234 can be spaced apart from each of the adjacent magnet arrays 234 by at least one coil width, such that each coil is only covered by one associated magnet array 234 (i.e. one associated X or Y magnet array). With this design, independent and symmetric magnetic flux distribution can be achieved for each of the magnet arrays 234, which not only highly reduces motor force ripples and side forces, but also makes position measurement easier. Stated in another manner, the desire for increasing motor force capability while inhibiting magnetic cross-coupling among arrays/quadrants of a moving-magnet planar motor (for smaller motor force ripples/side forces and better Hall sensor measurement) is achieved by keeping adjacent magnet arrays/quadrants spaced apart by at least one coil width.

The stage assembly 10 is particularly useful for precisely positioning the device 16 during a manufacturing and/or an inspection process. The type of device 16 positioned and moved by the stage assembly 10 can be varied. For example, in certain applications, the device 16 can be a semiconductor wafer 536 (illustrated in FIG. 5), and the stage assembly 10 can be a wafer stage assembly 538 (illustrated in FIG. 5) that is used as part of an exposure apparatus 540 (illustrated in FIG. 5) for precisely positioning the semiconductor wafer 536 during manufacturing of the semiconductor wafer 536. In such applications, the stage base 12 can be fixedly secured and/or coupled to an apparatus frame 542 (illustrated in FIG. 5) of the exposure apparatus 540. Alternatively, the device 16 can be a reticle 544 (illustrated in FIG. 5), and the stage assembly 10 can be a reticle stage assembly 546 (illustrated in FIG. 5) that is used as part of the exposure apparatus 540 for precisely positioning the reticle 544. Still alternatively, for example, the stage assembly 10 can be used to move other types of devices during manufacturing and/or inspection, to move a device under an electron microscope (not shown), or to move a device during a precision measurement operation (not shown).

The stage base 12 supports a portion of the stage assembly 10 above the mounting base 524. Additionally, the stage base 12 is coupled to the stage mover 18, receives reaction forces generated by the stage mover 18, and can be any suitable structure. In FIG. 1, the stage base 12 is rigid and generally rectangular shaped. In certain embodiments, the stage base 12 can be a reaction assembly that counteracts, reduces and minimizes the influence of the reaction forces from the stage mover 18 on the position of other structures on the exposure apparatus 540.

With the present design, (i) movement of the stage 14 with the stage mover 16 along the X axis, generates an equal and opposite X reaction force that moves the stage base 12 in the opposite direction along the X axis; (ii) movement of the stage 14 with the stage mover 16 along the Y axis, generates an equal and opposite Y reaction force that moves the stage base 12 in the opposite direction along the Y axis; and (iii) movement of the stage 14 with the stage mover 16 about the Z axis generates an equal and opposite theta Z reaction moment (torque) that moves the stage base 12 about the Z axis.

As noted above, the stage 14 retains the device 16. Further, the stage 14 is precisely moved by the stage mover 18 to precisely position the device 16. In the embodiments illustrated herein, the stage 14 is generally rectangular shaped and includes a device holder (not shown) for retaining the device 16. The device holder can be a vacuum chuck, an electrostatic chuck, or some other type of clamp.

The stage 14 can be maintained spaced apart from (e.g., above) the stage base 12 with the stage mover 18 if the stage mover 18 is a six degree of freedom mover that moves the stage 14 relative to the stage base 12 with six degrees of freedom. In this embodiment, the stage mover 18 functions as a magnetic type bearing that levitates the stage 14. Alternatively, for example, the stage 14 can be supported relative to the stage base 12 with a stage bearing (not shown), e.g., a vacuum preload type fluid bearing. For example, the bottom of the stage 14 can include a plurality of spaced apart fluid outlets (not shown), and a plurality of spaced apart fluid inlets (not shown). In this example, pressurized fluid (not shown) can be released from the fluid outlets towards the stage base 12 and a vacuum can be pulled in the fluid inlets to create a vacuum preload type, fluid bearing between the stage 14 and the stage base 12. In this embodiment, the stage bearing allows for motion of the stage 14 relative to the stage base 12 along the X axis, along the Y axis and about the Z axis.

The stage mover 18 controls and adjusts the position of the stage 14 and the device 16 relative to the stage base 12. For example, the stage mover 18 can be a planar motor that moves and positions the stage 14 along the X axis, along the Y axis and about the Z axis ("three degrees of freedom" or "the planar degrees of freedom"). Further, in certain embodiments, the stage mover 18 can also be controlled to move the stage 14 along the Z axis and about the X and Y axes. With this design, the stage mover 18 is a six degree of freedom mover. Alternatively, in certain embodiments, the stage mover 18 can be designed to move the stage 14 with less than six degrees of freedom.

As noted above, in the embodiments illustrated herein, the stage mover 18 includes the conductor assembly 26, and the adjacent magnet assembly 28 that interacts with the conductor assembly 26. In one embodiment, as illustrated in FIG. 1, the conductor assembly 26 is coupled to the stage base 12, and the magnet assembly 28 is secured to and moves with the stage 14. As provided herein, the assembly secured to the stage 14, e.g., the magnet assembly 28, can be referred to as the moving component of the stage mover 18, and the assembly secured to the stage base 12, e.g., the conductor assembly 26, can be referred to as the reaction component (or stator) of the stage mover 18.

The design of the conductor assembly 26 can be varied depending on the requirements of the stage assembly 10, the stage mover 18, and/or the magnet assembly 28. For example, as noted above, in certain embodiments, the conductor assembly 26 can include a plurality of coil units 30. Moreover, each coil unit 30 can include one or more coils 232, e.g., three coils 232, that are oriented to provide movement along the X-axis or the Y-axis. Alternatively, each coil unit 30 can include more than three or fewer than three coils 232. Each coil 232 can be made of a metal such as copper or any substance or material responsive to electrical current and capable of creating a magnetic field such as superconductors.

The design and number of coil units 30 in the conductor assembly 26 can vary according to the performance and movement requirements of the stage mover 18. For example, in the embodiment illustrated in FIG. 1, the conductor assembly 26 includes one hundred eight coil units 30 that are arranged in a generally rectangular twelve-by-nine array. Additionally, the individual coil units 30 can be arranged such that a plurality of X-coil units and a plurality of Y-coil units are positioned and/or arranged in an alternating pattern in both the X-direction and the Y-direction. Thus, in such embodiment, the conductor assembly 26 includes fifty-four X-coil units 30 and fifty-four Y-coil units 30 that are arranged in an alternating pattern in both the X-direction and the Y-direction. Alternatively, the conductor assembly 26 can include greater than or less than one hundred eight coil units 30, and/or the coil units 30 can be arranged in a different manner.

Further, as noted above, the magnet assembly 28 can include a plurality of magnet arrays 234. Moreover, each magnet array 234 includes one or more magnets (not illustrated in FIG. 1) that interact with the plurality of coil units 30. The design of the magnet assembly 28 and the number of magnet arrays 234 and/or the number of magnets in each magnet array 234 can be varied to suit the design requirements of the stage mover 18. In some embodiments, each magnet can be made of a permanent magnetic material such as NdFeB.

Electrical current (not shown) is supplied to the coil units 30 by the control system 22. The electrical current in the coil units 30 interacts with the magnetic field(s) of the one or more magnets in the magnet assembly 28. This causes a force (Lorentz type force) between the coil units 30 and the magnets that can be used to move the stage 14 relative to the stage base 12.

Unfortunately, the electrical current supplied to the conductor assembly 26 also generates heat, due to resistance in the conductor assembly 26. In FIG. 1, the heat from the conductor assembly 26 is subsequently transferred to the stage base 12. This can cause expansion and distortion of the stage base 12. Further, the heat from the conductor assembly 26 can be transferred to the surrounding environment, including the air surrounding the conductor assembly 26. This can adversely influence the measurement system 20 that measures the position of the stage 14 and the device 16.

In certain embodiments, to reduce the influence of the heat from the conductor assembly 26, a temperature controller (not shown) can actively control (i.e. cool) the temperature of the conductor assembly 26 to minimize the distortion of the stage base 12 and improve the positioning performance of the stage assembly 10. Stated in another fashion, the temperature controller can be used to reduce the influence of the heat from the conductor assembly 26 from adversely influencing the other components of the stage assembly 10 and the surrounding environment. With this design, the stage mover 18 can position the device 16 with improved accuracy.

The measurement system 20 monitors a position and/or movement of the stage 14 relative to the stage base 12, or to some other reference, such as an optical assembly 548 (illustrated in FIG. 5) of the exposure apparatus 540. With this information, the stage mover 18 can be controlled to precisely position the stage 14 and the device 16. For example, the measurement system 20 can utilize laser interferometers, encoders, and/or other measuring devices to monitor the position and/or movement of the stage 14 and the device 16.

The control system 22 is electrically connected to, and directs and controls electrical current to the coil units 30 of the stage mover 18 to precisely position the stage 14, and, thus, the device 16. More particularly, in certain applications, the control system 22 receives information from the measurement system 20 and directs and controls electrical current to the coil units 30 of the stage mover 18 to precisely position the stage 14 and the device 16 based at least in part on the information from the measurement system 20. The control system 22 can include one or more processors. It should be understood that when the stage assembly 10 is part of the exposure apparatus 540, the control system 22 that is provided as part of the stage assembly 10 can be included as part of a control system 550 (illustrated in FIG. 5) of the exposure apparatus 540.

FIG. 2 is a simplified schematic top view illustration of an embodiment of a stage mover 218 having features of the present invention that is usable as part of the stage assembly 10 illustrated in FIG. 1. More particularly, FIG. 2 is a simplified schematic top view illustration of an embodiment of a conductor assembly 226 and an embodiment of a magnet assembly 228 having features of the present invention that interacts with the conductor assembly 226.

The design and size of the conductor assembly 226 can be varied depending on the movement requirements of the stage assembly 10. As shown in FIG. 2, the conductor assembly 226 includes a plurality of coil units 230 that are aligned in a substantially rectangular array. More particularly, as illustrated, the conductor assembly 226 can include a plurality of first axis coil units 230A (sometimes referred to as "X coil units") and a plurality of second axis coil units 230B (sometimes referred to as "Y coil units"). Additionally, in this embodiment, the X coil units 230A and the Y coil units 230B are arranged in an alternating fashion, in a six-by-six array, to create a checkerboard pattern. With this design, the conductor assembly 226 as shown includes eighteen X coil units 230A and eighteen Y coil units 230B that are arranged in alternating fashion in the six-by-six array. It should be appreciated that in different embodiments, the six-by-six array of coil units 230, as shown in FIG. 2, can be the entirety of or only a portion of the conductor assembly 226. Moreover, the conductor assembly 226 can be formed to be any desired size such that the conductor assembly 226 can include greater than or less than eighteen X coil units 230A and/or greater than or less than eighteen Y coil units 230B.

Further, in certain embodiments, all of the coil units 230, i.e. all of the X coil units 230A and all of the Y coil units 230B, are in substantially the same plane and have the same Z axis position. With this design, the conductor assembly 226 is relatively easy to build and relatively easy to cool.

In the alternating checkerboard pattern, the coil units 230A, 230B are arranged to provide a precisely controlled force in the X or Y direction. Each of the coil units 230A, 230B can also provide an independently controlled force in the Z direction.

Additionally, in one embodiment, each of the coil units 230A, 230B can be substantially square-shaped, including three individual coils 232 that are positioned side-by-side. Alternatively, each coil unit 230A, 230B can include more than three or fewer than three coils 232, and/or the coils 232 can be positioned in a different manner relative to one another. Moreover, as noted above, each coil 232 can be made of a metal such as copper or any substance or material responsive to electrical current and capable of creating a magnetic field such as superconductors.

Further, as shown in FIG. 2, each individual coil 232 has a coil width 252 and a coil length 254. In one embodiment, the ratio of coil length 254 to coil width 252 is approximately 3:1. With such relative dimensions of the coils 232, three coils 232 positioned substantially side-by-side can effectively form the coil units 230 that are substantially square-shaped. It should be appreciated that the particular size of the individual coils 232 and the coil units 230 can be varied to accommodate different stage requirements.

The design of the magnet assembly 228 can be varied depending on the specific requirements of the stage assembly 10 and/or the stage mover 18. In the embodiment illustrated in FIG. 2, the magnet assembly 228 is substantially square-shaped and includes a plurality of magnet arrays 234, e.g., four magnet arrays 234. More particularly, as shown, the magnet assembly 228 includes a pair of substantially square-shaped first axis magnet arrays 256A, 256B (sometimes referred to as a "first X magnet array" 256A and a "second X magnet array 256B) that are positioned diagonally relative to one another; and a pair of substantially square-shaped second axis magnet arrays 258A, 258B (sometimes referred to as a "first Y magnet array" 258A and a "second Y magnet array" 258B) that are positioned diagonally relative to one another. In some embodiments, the requirements for the first axis and the second axis acceleration and duty cycle can be substantially similar, and, thus, the first axis magnet arrays 256A, 256B and the second axis magnet arrays 258A, 258B can be substantially similar in size and general design. Alternatively, the magnet assembly 228 and/or the magnet arrays 256A, 256B, 258A, 258B can be other than substantially square-shaped, or each of the magnet arrays 256A, 256B, 258A, 258B can be designed to interact with each of the coil units 230A, 230B. Still alternatively, in other embodiments, the requirements for the first axis and the second axis acceleration and duty cycle can be different, and, thus, the first axis magnet arrays 256A, 256B and the second axis magnet arrays 258A, 258B can be different in size and/or general design.

Additionally, each of the X magnet arrays 256A, 256B can include one or more X magnets 257 that are designed and oriented to interact with one or more of the X coil units 230A depending on the specific positioning of the X magnet arrays 256A, 256B relative to the X coil units 230A. Similarly, each of the Y magnet arrays 258A, 258B can include one or more Y magnets 259 that are designed and oriented to interact with one or more of the Y coil units 230B depending on the specific positioning of the Y magnet arrays 258A, 258B relative to the Y coil units 230B.

Further, as illustrated, each of the magnet arrays 256A, 256B, 258A, 258B is spaced apart from each of the adjacent magnet arrays 256A, 256B, 258A, 258B by an array gap 260. As disclosed herein, in the present invention, the array gap 260 is at a minimum substantially equal to the coil width 252. For example, in various embodiments, as shown, the array gap 260 is approximately equal to the coil width 252. Alternatively, the array gap 260 can be greater than the coil width 252.

More particularly, in this embodiment, (i) the first X magnet array 256A is spaced apart from the first Y magnet array 258A by an array gap 260 that is approximately equal to the coil width 252; (ii) the first X magnet array 256A is spaced apart from the second Y magnet array 258B by an array gap 260 that is approximately equal to the coil width 252; (iii) the second X magnet array 256B is spaced apart from the first Y magnet array 258A by an array gap 260 that is approximately equal to the coil width 252; and (iv) the second X magnet array 256B is spaced apart from the second Y magnet array 258B by an array gap 260 that is approximately equal to the coil width 252. With this design, each individual X or Y coil would only be covered by one associated magnet array 234, which makes a coil-by-coil switching method possible. Further, as noted above, independent and symmetric magnetic flux distribution can be achieved for each of the magnet arrays 234, which not only highly reduces motor force ripples and side forces, but also makes position measurement easier.

In alternative, non-exclusive embodiments, the ratio of array gap 260 to the coil width 252 is approximately 0.9, 0.95, 1, 1.05, 1.1, 1.15, 1.2, or 1.3. As provided herein, the ratio should be equal to or larger than one. There is no clear upper bound to the ratio. However, as the ratio gets larger, with the same motor force capacity, the overall stage footprint is also larger.

Additionally, in certain embodiments, air bearing pads (not shown) may be applied within the array gaps 260 between adjacent magnet arrays 234, which may help move the stage 14 (illustrated in FIG. 1) manually during machine maintenance or assembly. Further, such air bearing pads may support the weight of the stage 14 during regular machine operation to reduce planar motor current magnitudes necessary to levitate the stage. Moreover, the air bearing pads can also stiffen the mechanical structure and increase flexible mode frequency.

In another embodiment, if the array gap 260 is increased, e.g., such that the magnet arrays 234 were spaced apart from adjacent magnet arrays 234 by a distance equal to the width of an entire coil unit 230 (rather than just an individual coil 232), a unit-by-unit switching method would be possible. However, the greater the spacing between the magnet arrays 234, the larger the footprint is for the resulting motor, which would thus entail a heavy mass and low stiffness of the stage. Additionally, if the magnet arrays 234 were positioned substantially directly side-by-side without spacing, i.e. to reduce the motor footprint, large magnetic flux distortion would result, which not only lead to large unwanted motor force ripples and side forces, but also makes Hall sensor measurement more difficult.

During use of the stage mover 18, the control system 22 (illustrated in FIG. 1) can (i) direct current to certain X coil units 230A to create an interaction with the magnetic field(s) of the X magnet arrays 256A, 256B to generate two first axis forces along the first ("X") axis that are imparted on the stage 14 (illustrated in FIG. 1); and (ii) direct current to certain Y coil units 230B to create an interaction with the magnetic field(s) of the Y magnet arrays 258A, 258B to generate two second axis forces along the second ("Y") axis that are imparted on the stage 14. Further, in certain embodiments, the control system 22 can (i) direct current to certain X coil units 230A to create an interaction with the magnetic field(s) of the X magnet arrays 256A, 256B to generate two third axis forces along the third ("Z") axis that are imparted on the stage 14, and (ii) direct current to certain Y coil units 230B to create an interaction with the magnetic field(s) of the Y magnet arrays 258A, 258B to also generate two, third axis forces along the third ("Z") axis that are imparted on the stage 14.

The first axis forces can be used to move the stage 14 back and forth along the first ("X") axis, the second ("Y") axis forces can be used to move the stage 14 back and forth along the second axis, and the third axis forces can be used to move the stage 14 back and forth along the third ("Z") axis. Further, the forces can also be adjusted to control rotation of the stage 14 about the X, Y, and Z axes.

Figure 3:
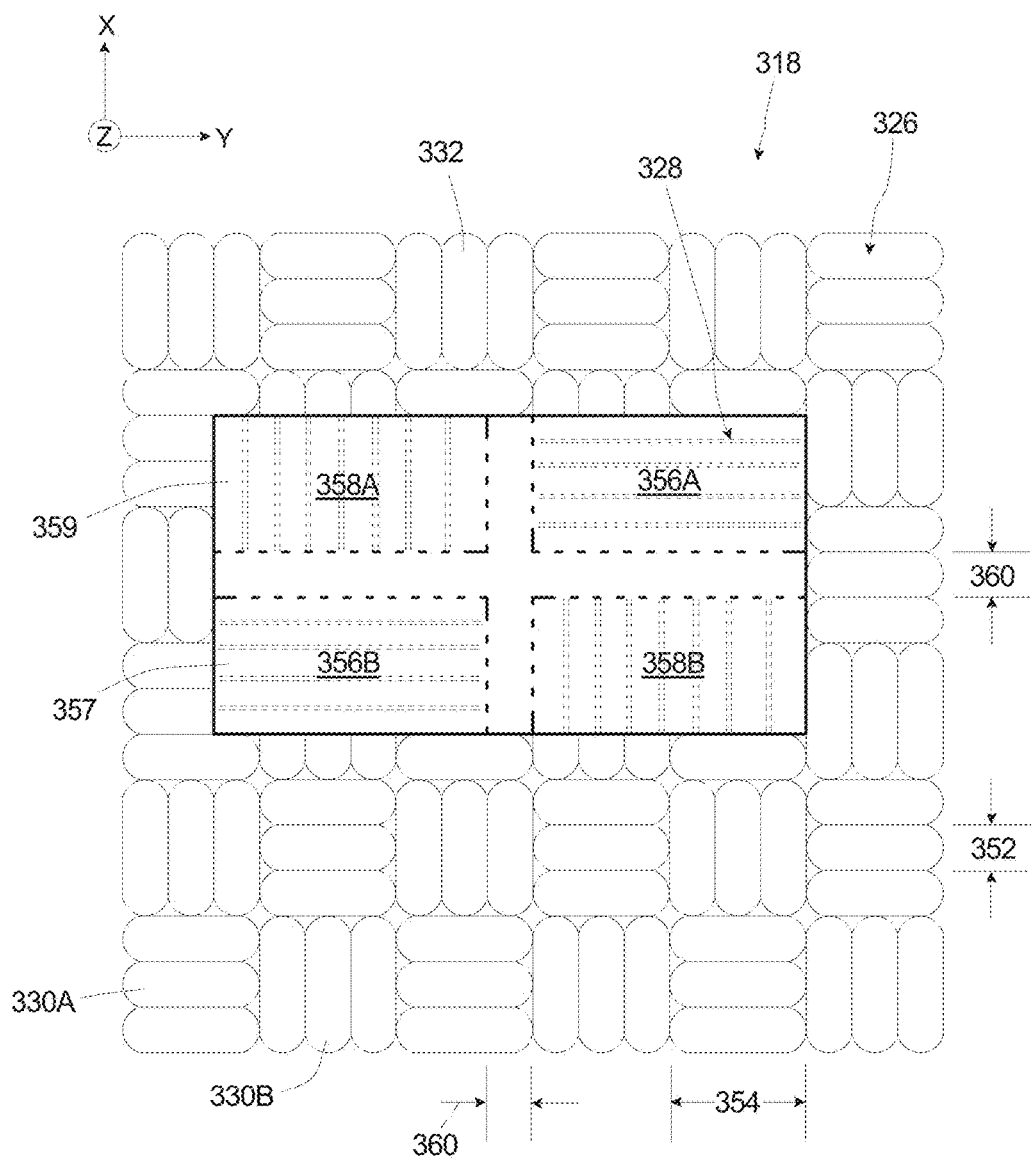
FIG. 3 is a simplified schematic top view illustration of another embodiment of a stage mover having features of the present invention that forms part of the stage assembly illustrated in FIG. 1.

FIG. 3 is a simplified schematic top view illustration of another embodiment of a stage mover 318 having features of the present invention that is usable as part of the stage assembly 10 illustrated in FIG. 1. More particularly, FIG. 3 is a simplified schematic top view illustration of the conductor assembly 326 and another embodiment of a magnet assembly 328 having features of the present invention that interacts with the conductor assembly 326.

As illustrated, the conductor assembly 326 is substantially similar, if not identical, to the conductor assembly 226 illustrated and described above in relation to FIG. 2. For example, the conductor assembly 326 again includes a plurality of first axis coil units 330A (sometimes referred to as "X coil units") and a plurality of second axis coil units 330B (sometimes referred to as "Y coil units") that are arranged in an alternating fashion, in a six-by-six array, to create a checkerboard pattern. In the alternating checkerboard pattern, the coil units 330A, 330B are again arranged to provide a precisely controlled force in the X or Y direction, while each of the coil units 330A, 330B can also provide an independently controlled force in the Z direction.

Additionally, in one embodiment, each of the coil units 330A, 330B can be substantially square-shaped, including three individual coils 332 that are positioned side-by-side. Further, each individual coil 332 has a coil width 352 and a coil length 354, with the ratio of coil length 354 to coil width 352 being approximately 3:1. With such relative dimensions of the coils 332, three coils 332 positioned substantially side-by-side can effectively form the coil units 330A, 330B that are substantially square-shaped.

Further, as illustrated, the magnet assembly 328 is somewhat similar to the magnet assembly 228 illustrated and described above in relation to FIG. 2. For example, the magnet assembly 328 again includes a pair of first axis magnet arrays 356A, 356B (sometimes referred to as a "first X magnet array" 356A and a "second X magnet array 356B) that are positioned diagonally relative to one another, each of the X magnet arrays 356A, 356B including one or more X magnets 357; and a pair of second axis magnet arrays 358A, 358B (sometimes referred to as a "first Y magnet array" 358A and a "second Y magnet array" 358B) that are positioned diagonally relative to one another, each of the Y magnet arrays 358A, 358B including one or more Y magnets 359.

Moreover, as illustrated, each of the magnet arrays 356A, 356B, 358A, 358B is again spaced apart from each of the adjacent magnet arrays 356A, 356B, 358A, 358B by an array gap 360 that can be approximately equal to the coil width 352. More particularly, in this embodiment, (i) the first X magnet array 356A is spaced apart from the first Y magnet array 358A by an array gap 360 that is approximately equal to the coil width 352; (ii) the first X magnet array 356A is spaced apart from the second Y magnet array 358B by an array gap 360 that is approximately equal to the coil width 352; (iii) the second X magnet array 356B is spaced apart from the first Y magnet array 358A by an array gap 360 that is approximately equal to the coil width 352; and (iv) the second X magnet array 356B is spaced apart from the second Y magnet array 358B by an array gap 360 that is approximately equal to the coil width 352. With this design, as noted above, independent and symmetric magnetic flux distribution can be achieved for each of the magnet arrays 356A, 356B, 358A, 358B, which not only highly reduces motor force ripples and side forces, but also makes position measurement easier.

However, as shown in FIG. 3, each of the magnet arrays 356A, 356B, 358A, 358B is somewhat smaller than in the previous embodiment due to different requirements for the stage assembly 10 and/or the stage mover 18. More specifically, in this embodiment, each of the magnet arrays 356A, 356B, 358A, 358B is substantially rectangle-shaped, and the overall magnet assembly 328 is also substantially rectangle-shaped. It should be noted that although the size and/or design of the magnet arrays 356A, 356B, 358A, 358B is somewhat different than in the previous embodiment, each of the magnet arrays 356A, 356B, 358A, 358B is still substantially similar in size and design to each of the other magnet arrays 356A, 356B, 358A, 358B.

Figure 4:
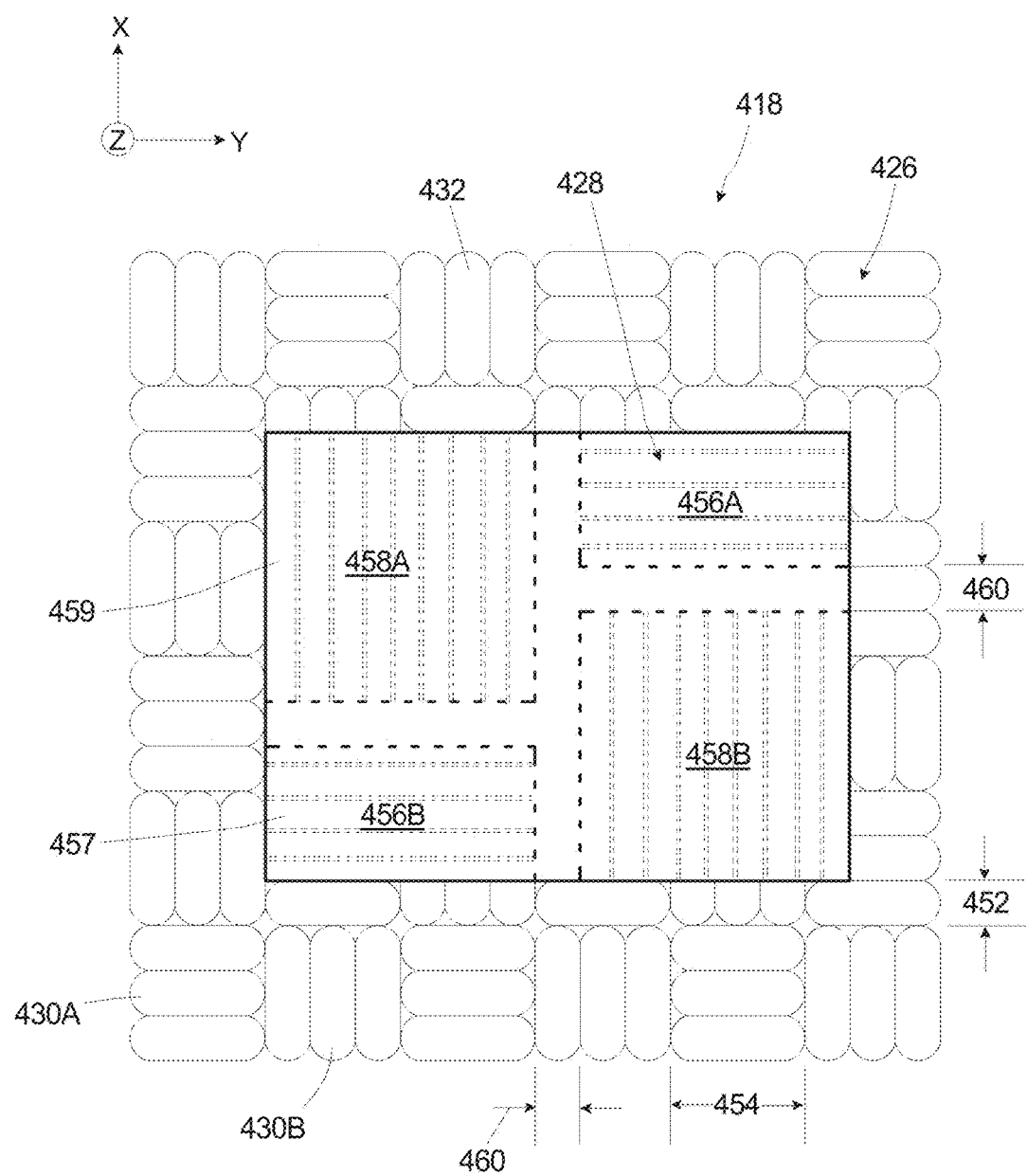
FIG. 4 is a simplified schematic top view illustration of still another embodiment of a stage mover having features of the present invention that forms part of the stage assembly illustrated in FIG. 1.

FIG. 4 is a simplified schematic top view illustration of still another embodiment of a stage mover 418 having features of the present invention that is usable as part of the stage assembly illustrated in FIG. 1. More specifically, FIG. 4 is a simplified schematic top view illustration of the conductor assembly 426 and still another embodiment of a magnet assembly 428 having features of the present invention that interacts with the conductor assembly 426.

As illustrated, the conductor assembly 426 is substantially similar, if not identical, to the conductor assemblies 226, 326 illustrated and described above. For example, the conductor assembly 426 again includes a plurality of first axis coil units 430A (sometimes referred to as "X coil units") and a plurality of second axis coil units 430B (sometimes referred to as "Y coil units") that are arranged in an alternating fashion, in a six-by-six array, to create a checkerboard pattern. In the alternating checkerboard pattern, the coil units 430A, 430B are again arranged to provide a precisely controlled force in the X or Y direction, while each of the coil units 430A, 430B can also provide an independently controlled force in the Z direction.

Additionally, in one embodiment, each of the coil units 430A, 430B can be substantially square-shaped, including three individual coils 432 that are positioned side-by-side. Further, each individual coil 432 has a coil width 452 and a coil length 454, with the ratio of coil length 454 to coil width 452 being approximately 3:1. With such relative dimensions of the coils 432, three coils 432 positioned substantially side-by-side can effectively form the coil units 430A, 430B that are substantially square-shaped.

Further, as illustrated, the magnet assembly 428 is somewhat similar to the magnet assemblies 228, 328 illustrated and described above. For example, the magnet assembly 428 again includes a pair of first axis magnet arrays 456A, 456B (sometimes referred to as a "first X magnet array" 456A and a "second X magnet array 456B), each of the X magnet arrays 456A, 456B including one or more X magnets 457; and a pair of second axis magnet arrays 458A, 458B (sometimes referred to as a "first Y magnet array" 458A and a "second Y magnet array" 458B), each of the Y magnet arrays 458A, 458B including one or more Y magnets 459.

Moreover, as illustrated, each of the magnet arrays 456A, 456B, 458A, 458B is again spaced apart from each of the adjacent magnet arrays 456A, 456B, 458A, 458B by an array gap 460 that can be approximately equal to the coil width 452. More particularly, in this embodiment, (i) the first X magnet array 456A is spaced apart from the first Y magnet array 458A by an array gap 460 that is approximately equal to the coil width 452; (ii) the first X magnet array 456A is spaced apart from the second Y magnet array 458B by an array gap 460 that is approximately equal to the coil width 452; (iii) the second X magnet array 456B is spaced apart from the first Y magnet array 458A by an array gap 460 that is approximately equal to the coil width 452; (iv) the second X magnet array 456B is spaced apart from the second Y magnet array 458B by an array gap 460 that is approximately equal to the coil width 452; and (v) the first Y magnet array 458A is spaced apart from the second Y magnet array 458B by an array gap 460 that is approximately equal to the coil width 452. With this design, as noted above, independent and symmetric magnetic flux distribution can be achieved for each of the magnet arrays 456A, 456B, 458A, 458B, which not only highly reduces motor force ripples and side forces, but also makes position measurement easier.

However, in this embodiment, the problem of optimizing the first axis (X axis) and the second axis (Y axis) performance of the stage mover 18 is addressed by independently adjusting certain characteristics (e.g., physical characteristics) of the magnet arrays 456A, 456B, 458A, 458B. The characteristics can include, for example, size of the magnet array, number of magnets included in the magnet array, magnet pitch of magnets disposed in the magnet array, dimension of magnet active area of the magnet array, and/or thickness of the magnet. For example, in the embodiment illustrated in FIG. 4, the problem of optimizing the first axis (X axis) and the second axis (Y axis) performance of the stage mover 18 is addressed by making one or both of the first axis magnet arrays 456A, 456B a different size than the second axis magnet arrays 458A, 458B. More particularly, the desired goal in this embodiment is to provide increased efficiency along the second axis (Y direction), while accepting lower performance along the first axis (X direction) as a tradeoff. In this example, one or both of the second axis magnet arrays 458A, 458B can be larger than the first axis magnet arrays 456A, 456B. With this design, the stage mover 18 will have improved efficiency along the second axis (Y direction), while accepting lower performance along the first axis (X direction) as a tradeoff. In the embodiment shown in FIG. 4, both of the second axis magnet arrays 458A, 458B are approximately twice as large as the first axis magnet arrays 456A, 456B. Alternatively, if the desired goal is to provide increased efficiency along the first axis (X direction), while accepting lower performance along the second axis (Y direction), one or both of the first axis magnet arrays 456A, 456B can be larger than the second axis magnet arrays 458A, 458B.

Figure 5:
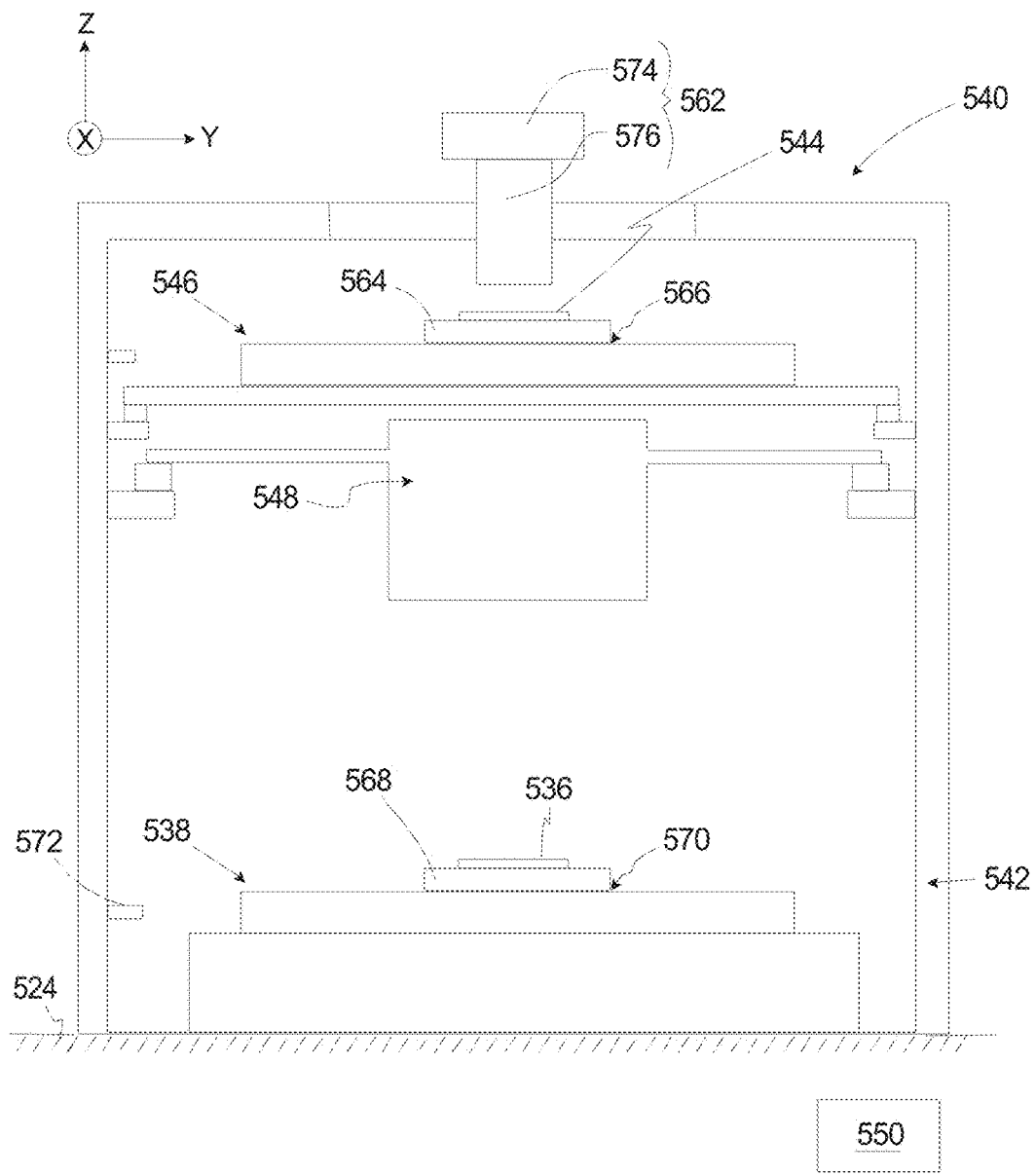
FIG. 5 is a schematic illustration of an exposure apparatus having features of the present invention.

FIG. 5 is a schematic illustration of a precision assembly, namely an exposure apparatus 540 useful with the present invention. The exposure apparatus 540 includes the apparatus frame 542, an illumination system 562 (irradiation apparatus), an optical assembly 548 (lens assembly), the reticle stage assembly 546 including a reticle stage 564 that holds a reticle 544 and a reticle stage mover 566 that moves the reticle stage 564 and the reticle 544, the wafer stage assembly 538 including a wafer stage 568 that holds a wafer 536 and a wafer stage mover 570 that moves the wafer stage 568 and the wafer 536, a measurement system 572, and a control system 550. The design of the various components of the exposure apparatus 540 can be varied to suit the specific requirements of the exposure apparatus 540. In certain applications, as noted above, the stage assembly 10 (illustrated in FIG. 1) can be utilized as the reticle stage assembly 546. Additionally and/or alternatively, the stage assembly 10 can be utilized as the wafer stage assembly 538.

The exposure apparatus 540 is particularly useful as a lithographic device that transfers a pattern (not shown) of an integrated circuit from the reticle 544 onto the semiconductor wafer 536. The exposure apparatus 540 mounts to a mounting base 524, e.g., the ground, a base, or floor or some other supporting structure.

There are a number of different types of lithographic devices. For example, the exposure apparatus 540 can be used as a scanning type photolithography system that exposes the pattern from the reticle 544 onto the wafer 536 with the reticle 544 and the wafer 536 moving synchronously. Alternatively, the exposure apparatus 540 can be a step-and-repeat type photolithography system that exposes the reticle 544 while the reticle 544 and the wafer 536 are stationary.

However, the use of the exposure apparatus 540 and stage assemblies provided herein is not limited to a photolithography system for semiconductor manufacturing. The exposure apparatus 540, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

The apparatus frame 542 is rigid and supports the components of the exposure apparatus 540. The design of the apparatus frame 542 can be varied to suit the design requirements of the rest of the exposure apparatus 540. The apparatus frame 542 illustrated in FIG. 5 supports the optical assembly 548, the reticle stage assembly 546, the wafer stage assembly 538, and the illumination system 562 above the mounting base 524.

The illumination system 562 includes an illumination source 574 and an illumination optical assembly 576. The illumination source 574 emits a beam (irradiation) of light energy. The illumination optical assembly 576 guides the beam of light energy from the illumination source 574 to the optical assembly 548. The beam of light energy selectively illuminates different portions of the reticle 544 and exposes the wafer 536. In FIG. 5, the illumination source 574 is illustrated as being supported above the reticle stage assembly 546. Alternatively, the illumination source 574 can be secured to one of the sides of the apparatus frame 542 and the energy beam from the illumination source 574 can be directed to above the reticle stage assembly 546 with the illumination optical assembly 576.

The illumination source 574 can be a g-line source (436 nm), an I-line source (365 nm), a Kef exciter laser (248 nm), an Art exciter laser (193 nm), a $F_2$ laser (157 nm), or a EUV source (13.5 nm). Alternatively, the illumination source 574 can generate charged particle beams such as an x-ray or an electron beam. For instance, in the case where an electron beam is used, thermionic emission type lanthanum hex boride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 548 projects and/or focuses the light passing through the reticle 544 to the wafer 536. Depending upon the design of the exposure apparatus 540, the optical assembly 548 can magnify or reduce the image illuminated on the reticle 544. The optical assembly 548 need not be limited to a reduction system. It could also be a 1× or magnification system.

The reticle stage assembly 546 holds and positions the reticle 544 relative to the optical assembly 548 and the wafer 536. As noted above, in FIG. 5, the reticle stage assembly 546 includes the reticle stage 564 that retains the reticle 544, and the reticle stage mover 566 that positions the reticle stage 564 and the reticle 544. In some embodiments, the reticle stage mover 566 can be designed to move the reticle 544 along the X, Y and Z axes, and about the X, Y and Z axes.

Somewhat similarly, the wafer stage assembly 538 holds and positions the wafer 536 with respect to the projected image of the illuminated portions of the reticle 544. As noted above, in FIG. 5, the wafer stage assembly 538 includes the wafer stage 568 that retains the wafer 536, and the wafer stage mover 570 that positions the wafer stage 568 and the wafer 536. In some embodiments, the wafer stage mover 570 can be designed to move the wafer 590 along the X, Y and Z axes, and about the X, Y and Z axes.

The measurement system 572 monitors movement of the reticle 544 and the wafer 536 relative to the optical assembly 548 or some other reference. With this information, the control system 550 can control the reticle stage assembly 546 to precisely position the reticle 544 and the wafer stage assembly 538 to precisely position the wafer 536. For example, the measurement system 572 can utilize multiple laser interferometers, encoders, autofocus systems, and/or other measuring devices.

The control system 550 can include one or more processors and circuits. The control system 550 is electrically connected to, and directs and controls electrical current to the coil units 30 (illustrated in FIG. 1) of the reticle stage mover 566 to precisely position the reticle 544, and/or of the wafer stage mover 570 to precisely position the wafer 536. Additionally, the control system 550 is connected to and receives information from the measurement system 572 to control the stage movers 566, 570 to precisely position the reticle 544 and the wafer 536.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment are performed to make sure that accuracy is maintained in the complete photolithography system. Additionally, it is desirable to manufacture an exposure system in a clean room where the temperature and cleanliness are controlled.

Figure 6A:
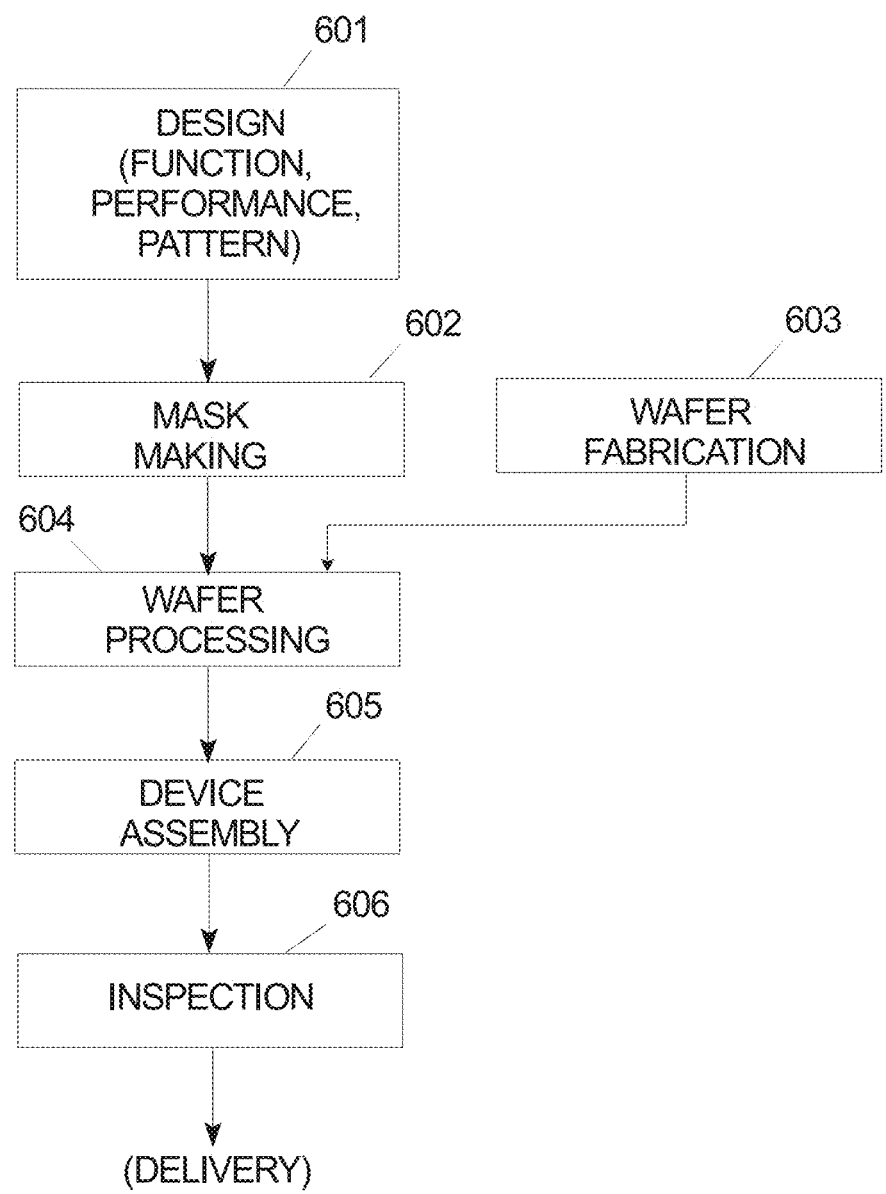
FIG. 6A is a flow chart that outlines a process for manufacturing a device in accordance with the present invention.

Semiconductor devices can be fabricated using the above described systems, by the process shown generally in FIG. 6A. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the present invention. In step 605 the semiconductor device is assembled (including the dicing process, bonding process and packaging process); finally, the device is then inspected in step 606.

Figure 6B:
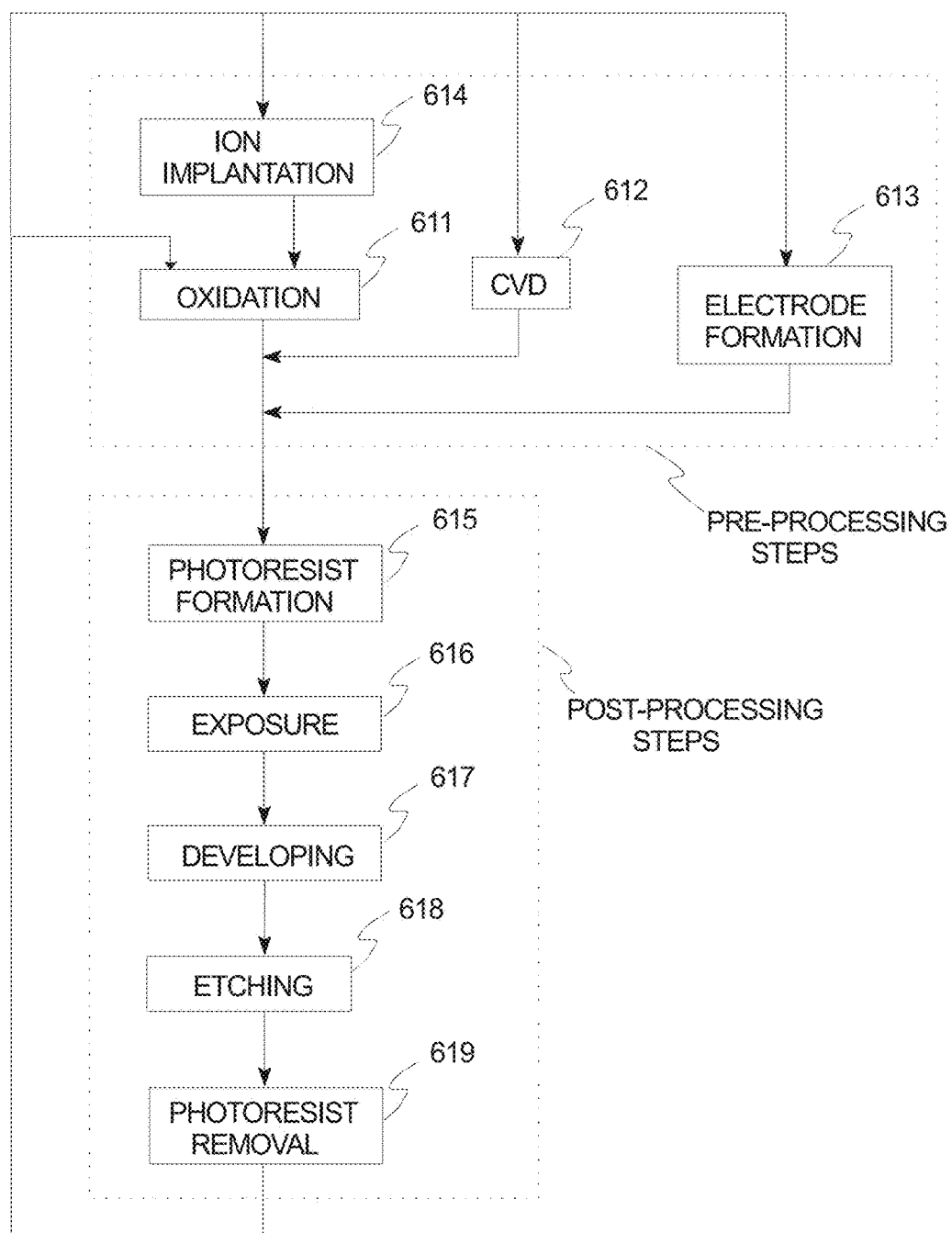
FIG. 6B is a flow chart that outlines device processing in more detail.

FIG. 6B illustrates a detailed flowchart example of the above-mentioned step 604 in the case of fabricating semiconductor devices. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611-614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

Figure 7:
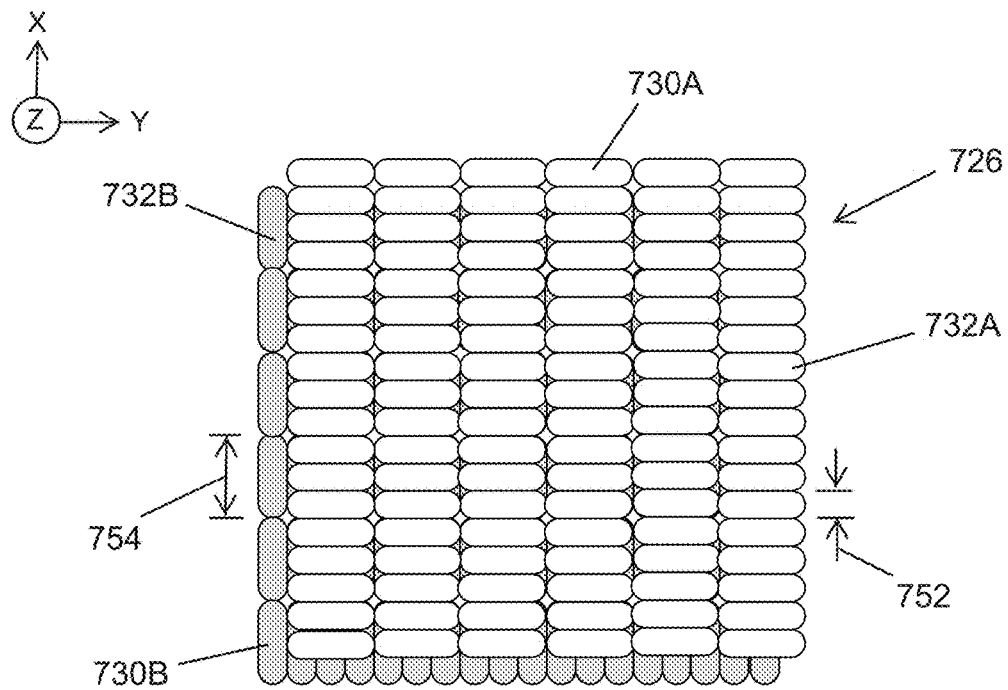
FIG. 7 is a simplified schematic top view illustration of another embodiment of a conductor assembly that can be used as part of the stage assembly illustrated in FIG. 1.

FIG. 7 is a simplified schematic top view illustration of another embodiment of a conductor assembly 726 that can be used as part of the stage assembly 10 illustrated in FIG. 1. More particularly, the conductor assembly 726 illustrated in FIG. 7 can be utilized in a similar manner as the conductor assemblies 26, 226, 326, 426 illustrated and described above with any of the magnet assemblies 228, 328, 428 as described above.

In FIG. 7, the conductor assembly 726 includes a pair of coil arrays, i.e. a first axis coil array 730A (sometimes referred to as an "X-axis coil array") that is oriented to provide movement along the X-axis, and a second axis coil array 730B (sometimes referred to as a "Y-axis coil array") that is oriented to provide movement along the Y-axis. Each of the coil arrays 730A, 730B can also provide an independently controlled force in the Z direction. Additionally, in this embodiment, the X-axis coil array 730A is positioned substantially on top of the Y-axis coil array 730B.

The design of the coil arrays 730A, 730B in the conductor assembly 726 can be varied as desired, and the coil arrays 730A, 730B can be substantially the same size as one another or a different size from one another. In one embodiment, as illustrated, the X-axis coil array 730A includes one hundred eight first axis coils 732A (sometimes referred to as "X-axis coils") that are positioned in a rectangular six-by-eighteen array, with each of the X-axis coils 732A being oriented to provide movement along the X-axis. Somewhat similarly, in one embodiment, the Y-axis coil array 730B includes one hundred eight second axis coils 732B (sometimes referred to as "Y-axis coils") that are positioned in a rectangular eighteen-by-six array, with each of the Y-axis coils 732B being oriented to provide movement along the Y-axis. Alternatively, each of the X-axis coil array 730A and the Y-axis coil array 730B can include greater than one hundred eight or fewer than one hundred eight coils 732A, 732B, respectively, and/or the coils 732A, 732B can be positioned in a different manner than is illustrated in FIG. 7.

Further, as shown in FIG. 7, each individual coil 732A, 732B has a coil width 752 and a coil length 754. In one embodiment, the ratio of coil length 754 to coil width 752 is approximately 3:1.

As noted above, in this embodiment, the X-axis coil array 730A is positioned substantially on top of the Y-axis coil array 730B along the Z axis. Additionally, as illustrated, the X-axis coil array 730A can be offset slightly (e.g. along the X and/or Y axis) relative to the Y-axis coil array 730B. More particularly, in this embodiment, the X-axis coil array 730A is offset relative to the Y-axis coil array 730B in each of the X direction and the Y direction by approximately one coil width 752. Alternatively, the X-axis coil array 730A can be offset relative to the Y-axis coil array 730B in each of the X direction and the Y direction by more or less than one coil width 752; and/or the X-axis coil array 730A can be positioned such that the X-axis coil array 730A is not offset from the Y-axis coil array 730B in the X direction and/or the Y direction.

Figure 8:
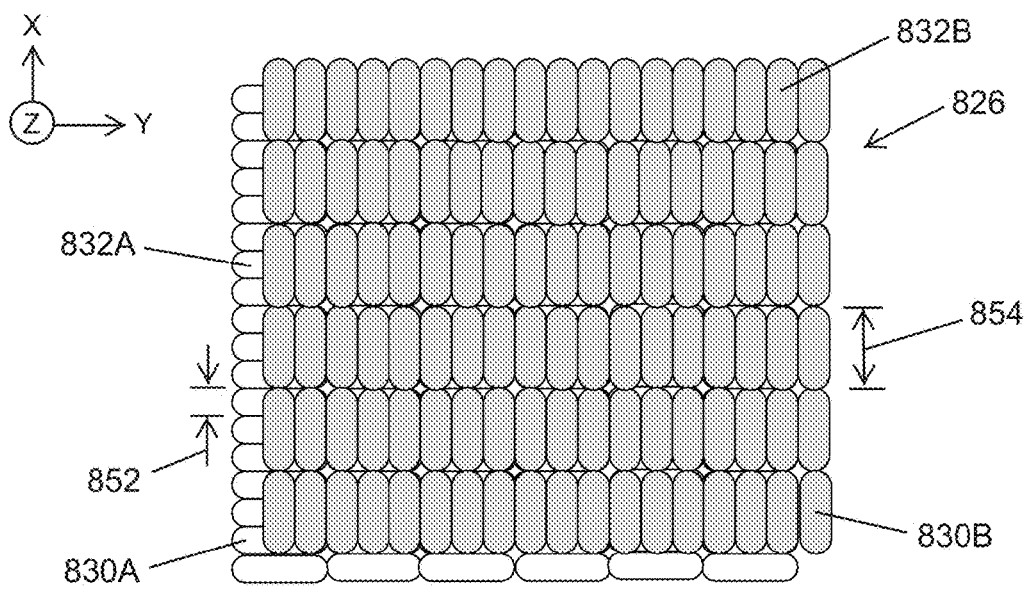
FIG. 8 is a simplified schematic top view illustration of still another embodiment of a conductor assembly that can be used as part of the stage assembly illustrated in FIG. 1.

FIG. 8 is a simplified schematic top view illustration of still another embodiment of a conductor assembly 826 that can be used as part of the stage assembly 10 illustrated in FIG. 1. The conductor assembly 826 is substantially similar to the conductor assembly 726 illustrated and described above in relation to FIG. 7, and the conductor assembly 826 can be utilized in a similar manner as the conductor assemblies 26, 226, 326, 426 illustrated and described above with any of the magnet assemblies 228, 328, 428 as described above.

As illustrated, the conductor assembly 826 includes a pair of coil arrays, i.e. a first axis coil array 830A (sometimes referred to as an "X-axis coil array") that is oriented to provide movement along the X-axis, and a second axis coil array 830B (sometimes referred to as a "Y-axis coil array") that is oriented to provide movement along the Y-axis. Each of the coil arrays 830A, 830B can also provide an independently controlled force in the Z direction. Additionally, in this embodiment, the Y-axis coil array 830B is positioned substantially on top of the X-axis coil array 830A.

The design of the coil arrays 830A, 830B in the conductor assembly 826 can be varied as desired, and the coil arrays 830A, 830B can be substantially the same size as one another or a different size from one another. In one embodiment, as illustrated, the X-axis coil array 830A includes one hundred eight first axis coils 832A (sometimes referred to as "X-axis coils") that are positioned in a rectangular six-by-eighteen array, with each of the X-axis coils 832A being oriented to provide movement along the X-axis. Somewhat similarly, in one embodiment, the Y-axis coil array 830B includes one hundred eight second axis coils 832B (sometimes referred to as "Y-axis coils") that are positioned in a rectangular eighteen-by-six array, with each of the Y-axis coils 832B being oriented to provide movement along the Y-axis. Alternatively, each of the X-axis coil array 830A and the Y-axis coil array 830B can include greater than one hundred eight or fewer than one hundred eight coils 832A, 832B, respectively, and/or the coils 832A, 832B can be positioned in a different manner than is illustrated in FIG. 8.

Further, as shown in FIG. 8, each individual coil 832A, 832B has a coil width 852 and a coil length 854. In one embodiment, the ratio of coil length 854 to coil width 852 is approximately 3:1.

As noted above, in this embodiment, the Y-axis coil array 830B is positioned substantially on top of the X-axis coil array 830A. Additionally, as illustrated, the Y-axis coil array 830B can be offset slightly relative to the X-axis coil array 830A. More particularly, in this embodiment, the Y-axis coil array 830b is offset relative to the X-axis coil array 830A in each of the X direction and the Y direction by approximately one coil width 852. Alternatively, the Y-axis coil array 830B can be offset relative to the X-axis coil array 830A in each of the X direction and the Y direction by more or less than one coil width 852; and/or the Y-axis coil array 830B can be positioned such that the Y-axis coil array 830B is not offset from the X-axis coil array 830A in the X direction and/or the Y direction.

In summary, as provided in detail herein above, the present invention achieves an excellent balance between motor force capacity and controllability. For example, the present invention provides the maximal magnet coverage of the motor footprint without increasing motor force ripples and side forces and without sacrificing the ease of coil switching and Hall sensor measurement.

While a number of exemplary aspects and embodiments of a stage assembly 10, a stage mover 18 and a magnet assembly 28 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A stage mover for moving a stage relative to a stage base, the stage mover comprising:
    a conductor assembly that is coupled to the stage base, the conductor assembly including a plurality of first axis coil units and a plurality of second axis coil units, with each coil unit having one or more coils, each of the coils having a coil width; and
    a magnet assembly that is coupled to the stage and interacts with the conductor assembly, the magnet assembly including a pair of spaced apart first axis magnet arrays and a pair of spaced apart second axis magnet arrays, each first axis magnet array including a plurality of first axis magnets that are oriented to interact with one or more of the first axis coil units to generate a force along a first axis, each second axis magnet array including a plurality of second axis magnets that are oriented to interact with one or more of the second axis coil units to generate a force along a second axis, wherein each of the first axis magnet arrays is spaced apart from each of the second axis magnet arrays by an array gap.

2. The stage mover of claim 1 wherein each of the first axis magnet arrays is spaced apart from each of the second axis magnet arrays by the array gap that is equal to or greater than the coil width.

3. The stage mover of claim 1 wherein each of the coil units includes three coils.

4. The stage mover of claim 1 wherein the plurality of first axis coil units and the plurality of second axis coil units are arranged in alternating fashion in a first axis direction and a second axis direction.

5. The stage mover of claim 4 wherein the pair of spaced apart first axis magnet arrays interact with one or more of the first axis coil units, and wherein the pair of spaced apart second axis magnet arrays interact with one or more of the second axis coil units.

6. A stage assembly including a stage base; a stage; and the stage mover of claim 1 that moves the stage relative to the stage base.

7. The stage assembly of claim 6 further comprising a control system that directs current to one or more of the coil units to create an interaction with one or more of the magnet arrays.

8. An exposure apparatus including an illumination source, and the stage assembly of claim 6 that moves the stage relative to the illumination system.

9. A process for manufacturing a device that includes the steps of providing a substrate and forming an image to the substrate with the exposure apparatus of claim 8.

10. The stage mover of claim 1 wherein the second axis magnet arrays are positioned diagonally relative to one another, and the first axis magnet arrays are positioned diagonally relative to one another.

11. A method for moving a stage relative to a stage base, the method comprising:
coupling a conductor assembly to the stage base, the conductor assembly including a plurality of first axis coil units and a plurality of second axis coil units, with each coil unit having one or more coils, each of the coils having a coil width; and
coupling a magnet assembly to the stage that interacts with the conductor assembly, the magnet assembly including a pair of spaced apart first axis magnet arrays and a pair of spaced apart second axis magnet arrays, each first axis magnet array including a plurality of first axis magnets that are oriented to interact with one or more of the first axis coil units to generate a force along a first axis, each second axis magnet array including a plurality of second axis magnets that are oriented to interact with one or more of the second axis coil units to generate a force along a second axis, wherein each of the first axis magnet arrays is spaced apart from each of the second axis magnet arrays by an array gap that is equal to or greater than the coil width.

12. The method of claim 11 wherein coupling a magnet assembly includes each of the first axis magnet arrays being spaced apart from each of the second axis magnet arrays by the array gap that is substantially equal to the coil width.

13. The method of claim 11 wherein coupling a conductor assembly includes the plurality of first axis coil units and the plurality of second axis coil units being arranged in alternating fashion in a first axis direction and a second axis direction.

14. The method of claim 13 wherein coupling a magnet assembly includes the pair of spaced apart first axis magnet arrays interacting with one or more of the first axis coil units, and the pair of spaced apart second axis magnet arrays interacting with one or more of the second axis coil units.

15. A method for exposing a work piece, the method comprising securing work piece to a stage, moving the stage by the method of claim 11, and exposing the work piece with an energy beam.

16. The method of claim 11 wherein coupling a magnet assembly includes the second axis magnet arrays being positioned diagonally relative to one another, and the first axis magnet arrays being positioned diagonally relative to one another.

* * * * *